United States Patent [19]
Ohtaka

[11] Patent Number: 6,100,157
[45] Date of Patent: Aug. 8, 2000

[54] FORMATION OF ALIGNMENT MARK AND STRUCTURE COVERING THE SAME

[75] Inventor: Shiro Ohtaka, Tokyo, Japan

[73] Assignee: Oki Electric Industry Co., Ltd., Tokyo, Japan

[21] Appl. No.: 09/228,576

[22] Filed: Jan. 12, 1999

Related U.S. Application Data

[62] Division of application No. 09/100,876, Jun. 22, 1998.

[51] Int. Cl.[7] .................................................. H01L 21/76
[52] U.S. Cl. ......................... 438/401; 438/462; 257/797
[58] Field of Search ................................... 438/401, 462, 438/800; 257/797, 798

[56] References Cited

U.S. PATENT DOCUMENTS

| | | |
|---|---|---|
| 5,405,810 | 4/1995 | Mizuno et al. . |
| 5,858,854 | 10/1996 | Tsai et al. ................................ 438/401 |
| 5,898,227 | 2/1997 | Geffken et al. ......................... 257/797 |

FOREIGN PATENT DOCUMENTS 0 448 471 A2   9/1991   European Pat. Off. .

*Primary Examiner*—Charles Bowers
*Assistant Examiner*—Craig Thompson
*Attorney, Agent, or Firm*—Jones Volentine, L.L.P.

[57] ABSTRACT

An alignment mark AM appears on the surface of an aluminum (Al) wiring layer 110 when the Al wiring layer is formed to fill up a recess 108 therewith, the recess 108 being formed in oxide layers 104 and 106 formed over the surface of a silicon substrate 102 by etching these layers in part. The depth of the recess 108 is controlled such that there is formed no direct contact between the Al wiring layer 110 and the metallic silicon of the silicon substrate 102. Consequently, in the process of forming the alignment mark, the Al wiring layer 110 is prevented from chemically reacting with the metallic silicon. Thus, there is caused neither deterioration in the quality of oxide films 104 and 106, nor destruction of the alignment mark AM appearing on the surface of the Al wiring layer 110, even if the Al wiring layer 110 is formed by sputtering aluminum on oxide layers and the recess as well at a high temperature.

13 Claims, 3 Drawing Sheets

FORMATION OF ALIGNMENT MARK AND STRUCTURE COVERING THE SAME

CROSS REFERENCE TO RELATED APPLICATIONS

This is a divisional application of application Ser. No. 09/100,876, filed Jun. 22, 1998.

BACKGROUND OF THE INVENTION

This invention generally relates to formation of an alignment mark, and more particularly relates to a method for forming an alignment mark which is employed in the process of manufacturing a silicon semiconductor device, especially in the process of forming a microscopic electronic structure on the surface of a semiconductor or silicon substrate. The invention also relates to a method for forming a structure covering the alignment mark for protection thereof.

In the process of manufacturing a semiconductor device, the photolithographic process is generally employed to process a desired microscopic semiconductor structure on a semiconductor or silicon substrate surface. This photolithographic process typically consists of the steps of forming a photoresist film to cover the silicon substrate surface; projecting the light on the photoresist film to focus a predetermined light pattern thereon with help of an optical projector; developing in part the photoresist film exposed to the light; removing the remaining photoresist film unexposed to the light; and etching the semiconductor substrate surface portion as revealed by removing the photoresist film until the desired pattern protected by the photoresist is appreciably obtained. This photolithographic process is repetitively performed using several different patterns until the desired microscopic semiconductor structure is completed on the semiconductor substrate surface. Therefore, in the photolithographic process, it is strictly required to accurately align the pattern previously formed on the substrate with a pattern which is to be formed next thereon. In other words, the photolithographic process requires a so-called precise alignment process for aligning one pattern with the next. In order to accurately carry out this process, some marks are employed as alignment marks which are provided in predetermined positions on the substrate surface, and relative positioning between patterns is performed referring to these marks.

Typically, formation of these marks may be simultaneously executed in parallel with other processes such as a process for forming an electrical wiring over the substrate. This process will now be described with reference to FIGS. 4 and 5 showing a prior art method in which formation of the alignment mark is carried out in parallel with formation of an aluminum wiring over the substrate. At first, a silicon oxide film layer 12 is formed to cover the surface of a silicon substrate 10. While some holes for use in the aluminum wiring are bored by etching the oxide film layer 12 with a suitable etchant, formation of recesses 14 is carried out by etching the oxide film 12 at predetermined positions where alignment marks are expected to be located. As shown in FIG. 5, after the above etching process of the oxide film layer 12, a conductive material such as aluminum (Al) is sputtered over the oxide film layer 12 to form an Al wiring layer 16. When the Al wiring layer 16 is completed, such a recess as indicated in the figure comes out on the surface of the Al wiring layer 16, in correspondence with the position of each recess 14 formed by etching the oxide film layer 12 in part. Thus, these recesses can be used as alignment marks AM. As described above, the recess 14 plays a role as a base which defines the position of a designed or planned alignment mark AM. Therefore, for the purpose of simplifying the description, the recess 14 will be referred to as 'base recess' hereinafter in this specification as well as in the recitation of claims as attached hereto.

In case of forming the base recess 14 for alignment mark AM by etching the oxide film layer 12 in part, its depth has to be carefully controlled, as shown in FIGS. 4 and 5, to avoid that the base recess 14 reaches the silicon substrate 10 by excess etching. Despite the control of this etching process, however, such excess etching might sometimes happen depending on unexpected change in the etching condition, for instance etching time, etching temperature, etchant, etc. Once such excess etching has happened, the base recess reaches the silicon substrate, so that the Al wiring layer 16 directly comes in contact with metallic silicon of the silicon substrate 10 when the Al wiring layer 16 is formed over the oxide film layer 12. Aluminum and silicon are essentially so active to each other that an Al—Si alloy is formed at the interface therebetween, if the Al wiring layer 16 is formed at a high temperature such as 500° C. Therefore, according to the prior art method as described above, when aluminum wiring layer 16 and silicon substrate Si come in contact with each other under such high temperature condition, Al—Si chemical reaction rapidly and vigorously proceeds to produce a reaction layer 18, and the oxide film layer 12 is violently attacked and destroyed during this chemical reaction, as shown in FIG. 6, thereby the desired alignment mark AM being eliminated.

OBJECT AND SUMMARY OF THE INVENTION

Accordingly, the invention has been made in view of such a problem as described in the above. Therefore, the first object of the invention is to provide a novel and improved method for forming alignment mark which can be stably maintained without being destroyed by rapid and vigorous Al—Si chemical reaction even when the alignment mark and the Al wiring layer are simultaneously formed at a high temperature.

Another object of the invention is to provide a novel and improved method for covering an alignment mark, according to which the alignment mark already formed on the silicon substrate can be protected from being destroyed by rapid and vigorous Al—Si chemical reaction.

In order to solve such problem as mentioned in the above, according to the first aspect of the invention, there is provided a method for forming an alignment mark, which includes the steps of forming an oxide film over the surface of a silicon substrate, forming a base recess by etching the oxide film in part, and forming an Al wiring layer over the oxide film so as to fill up the base recess therewith, thereby causing a mark as an alignment mark to come out at a point on the surface of the Al wiring layer in correspondence with the position of the base recess. In this case, according to the present invention, the base recess is formed such that it has a depth less than that (thickness) of the oxide film, so that the metallic silicon of the silicon substrate can not make any direct contact with the Al wiring layer.

As described above, since the alignment mark according to the invention can be formed without causing any direct contact between the Al wiring layer and the metallic silicon of the silicon substrate, there is no possibility that they chemically reacts with each other. Thus, there is caused neither deterioration in the quality of the oxide film, nor destruction of the alignment mark formed on the surface of the Al wiring layer.

To put it more concretely, it may be possible to achieve such an alignment mark as described in the above by using a method including the steps of additionally forming the second oxide film over the oxide film which is initially formed over the silicon substrate surface, and then forming the base recess by etching this second oxide film in part. With the addition of the second oxide film, there will be further reduced a possibility that the metallic silicon of the silicon substrate is exposed to the inside of the base recess, even though the depth of the base recess is made deeper to some extent, thus the Al wiring layer being prevented from making a direct contact with the metallic silicon of the silicon substrate.

Furthermore, according to the second aspect of the invention, an alignment mark may be obtained by using a method including the steps of forming an aluminum layer over the oxide film which is initially formed over the silicon substrate surface, then forming second oxide film over the aluminum layer, forming the base recess by etching the second oxide layer in part, and finally forming the Al wiring layer over the second oxide film. With addition of this aluminum layer, there is eliminated a possibility that the base recess for alignment mark reaches the metallic silicon of the silicon substrate, penetrating through the aluminum layer. Consequently, the metallic silicon of the silicon substrate is not exposed to the inside of the base recess and the Al wiring layer is prevented from making a direct contact with the metallic silicon of the silicon substrate.

Still further, according to the third aspect of the invention, there is provided a structure for covering the alignment mark, which is formed by a method including the steps of forming an oxide film over the surface of a silicon substrate, forming a base recess by etching the oxide film in part, and forming the second oxide film over the initial oxide film over the silicon substrate so as to fill up the base recess already formed therein. According to this covering structure, since the base recess formed in the oxide film over the silicon substrate is filled up with the second oxide, the Al wiring layer to be formed over the second oxide film can not come in contact with the metallic silicon of the silicon substrate. Consequently, there is caused neither Al—Si chemical reaction nor destruction of the base recess already formed in the oxide film over the silicon substrate.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings.

PREFERRED EMBODIMENTS OF THE INVENTION

Preferred embodiments according to the invention will now be described in the following with reference to accompanying drawings.

Figure 1:
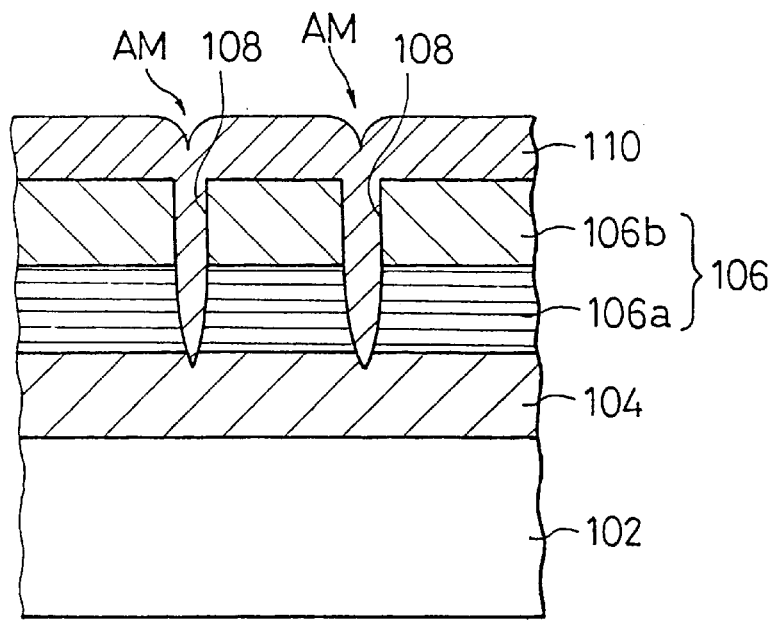
FIG. 1 is a longitudinal sectional view showing the structure of an alignment mark according to the first embodiment of the invention.

FIG. 1 is a longitudinal sectional view showing the structure of an alignment mark AM according to the first embodiment of the invention. This alignment mark AM is applied to the case where an Al wiring is formed over a field oxide film.

As shown in the figure, the first oxide film layer 104 is formed to cover the surface of a silicon substrate 102. This oxide film layer 104 is formed by oxidizing the surface of a cleaned silicon substrate 102 through a known ordinary oxidation treatment such as thermal oxidation with the help of an oxidation furnace, natural oxidation by leaving the silicon substrate in the high level clean room air for a predetermined period of time, or the like.

The second oxide film layer 106 is formed over the first oxide film layer 104. This second oxide film layer 106 consists of two oxide film layers 106a and 106b which are stacked up one by one on the film 104. Formation of these oxide film layers 106a and 106b may be achieved by using a known method as properly selected, for instance the method of chemical vapor deposition (CVD). Alternatively, this second oxide film layer 106 may be formed as a single oxide film layer or as a multiple oxide film layer including three or more oxide film layers.

As shown in the figure, the second oxide film layer 106 includes the base recess 108, which may be formed by gas etching using a fluoride gas as an etchant such that it takes a preset position on the oxide film layer 106.

On the second oxide film layer 106, there is still further provided an Al wiring layer 110, which is formed by sputtering aluminum as a wiring material on the oxide film layer 106. As a result of forming the Al wiring layer 110 over the second oxide film layer 106, the alignment mark AM comes out on the surface of the Al wiring layer 110 taking a position in correspondence with the base recess 108.

As described in the above, according to the embodiment shown in FIG. 1, the second oxide film layer 106 is additionally formed to cover the first oxide film layer 104 over the silicon substrate 102. Accordingly, when etching the base recess 108, even if the depth of the base recess 108 is made deeper to some extent by some reason, the metallic silicon of the silicon substrate 102 is prevented from being exposed to the inside of the base recess 108. If there is a high possibility that excess etching of the base recess 108 might happen due to the unavoidable or uncontrollable change in the environmental condition, the second oxide film layer 106 may be made thicker by increasing the number of its component film layers.

Figure 2:
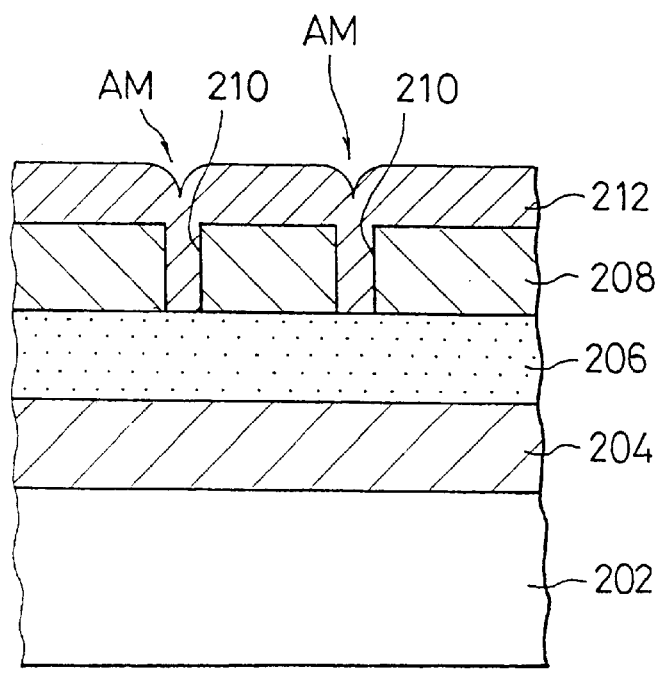
FIG. 2 is a longitudinal sectional view showing the structure of an alignment mark according to the second embodiment of the invention.

FIG. 2 is a longitudinal sectional view showing the structure of an alignment mark AM according to the second embodiment of the invention. This alignment mark AM is applied to the case where a multiple wiring structure is formed over the silicon substrate.

In this embodiment, the first oxide film layer 204 is formed over the surface of the silicon substrate 202 by means of the thermal oxidation process or the natural oxidation in which the silicon substrate is kept in the high level dust-free clean room air for a preset period of time, or the like. Next, a lower Al layer 206 is formed over the first oxide film layer 204. This lower aluminum layer 206 is formed by sputtering aluminum on the first oxide film layer 204 in the same way of forming the Al wiring layer 110 in the first embodiment as mentioned in the above.

Furthermore, the second oxide film layer 208 is formed over the lower Al layer 206. Formation of this second oxide film layer 208 is carried out through the CVD process in the same way as formation of the second oxide film layer 106 according to the first embodiment. In this example shown in FIG. 2, the second oxide film layer 208 is formed as a multiple film layer including two or more film layers.

In the next, the base recess 210 for alignment mark AM is formed taking a predetermined position on the second oxide film layer 208, by gas etching using a fluoride gas as an etchant in the same way of forming the base recess 108 in the above first embodiment.

An upper Al wiring layer 212 is then formed over the second oxide film layer 208. This upper Al wiring layer 212 may be formed by sputtering aluminum on the second oxide film layer 208 in the same way of forming the Al wiring layer 110 according to the first embodiment. Formation of the upper Al wiring layer 212 over the second oxide film layer 208 causes the alignment mark AM to come out on the surface of the upper Al wiring layer 212, taking a position corresponding to the base recess 210.

According to the embodiment as shown in FIG. 2, the etchant such as a fluoride gas used for etching the second oxide film layer 208 can not etch the lower aluminum layer 206, which rather functions as a barrier against such etchant. Therefore, when forming the base recess 210, there is no possibility that the metallic silicon of the silicon substrate 202 is exposed to the inside of the base recess 210.

In any event, when forming the base recesses 108 and 210 according to the first and second embodiments of the invention, there is caused neither exposure of the metallic silicon of the silicon substrate 102 or 202 to the inside of the base recess 108 or 210, nor direct contact between the metallic silicon of the silicon substrate and the Al wiring layer 110 or the upper Al wiring layer 212. Consequently, there happens neither the Al—Si chemical reaction, nor deterioration in the quality of the first and second oxide film layers 102, 106 and 202, 208, nor destruction of the alignment mark AM. Therefore, the alignment mark AM can be accurately formed and stably maintained, thereby enabling the precise pattern alignment to be achieved. As shown in FIG. 2, in case of forming the lower Al layer 206 over the surface of silicon substrate 202, it is preferable to form the oxide film layer 204 covering the surface of the silicon substrate 202 in order to avoid the direct contact between the lower Al layer 206 and the metallic silicon of the silicon substrate 202.

Figure 3:
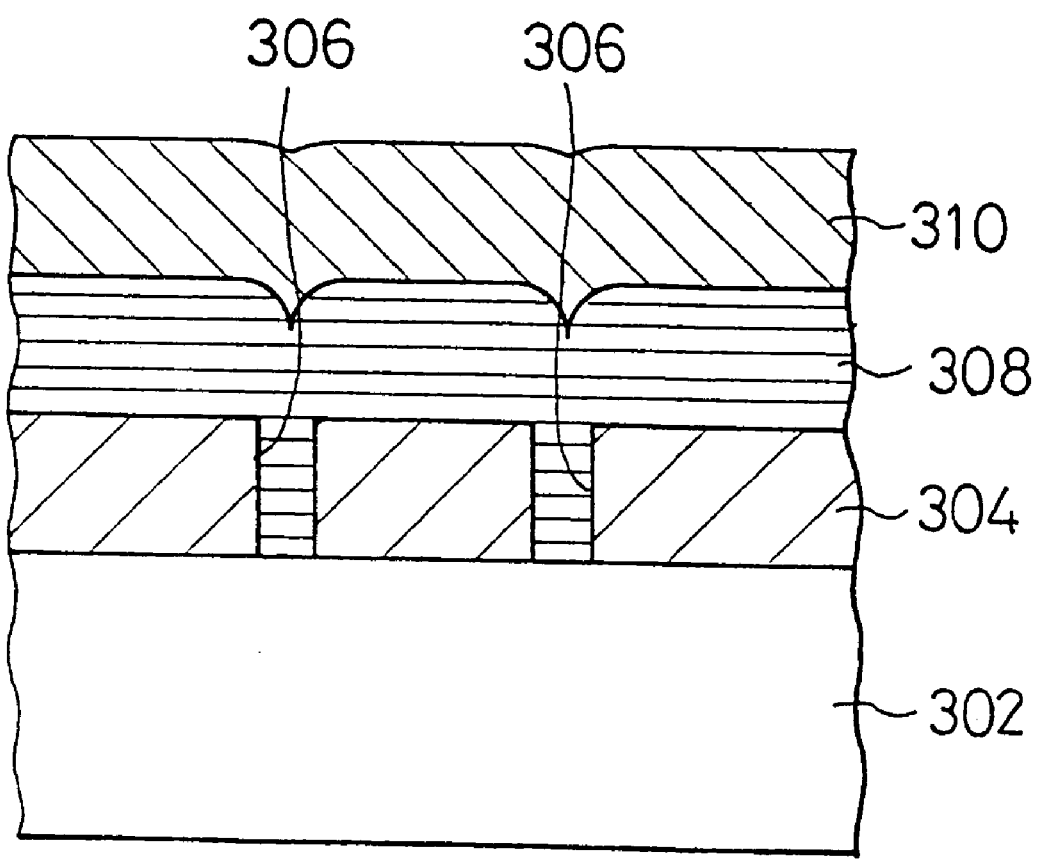
FIG. 3 is a longitudinal sectional view of a silicon substrate for the purpose of explaining a method for covering a base recess according to the third embodiment of the invention.
Figure 4:
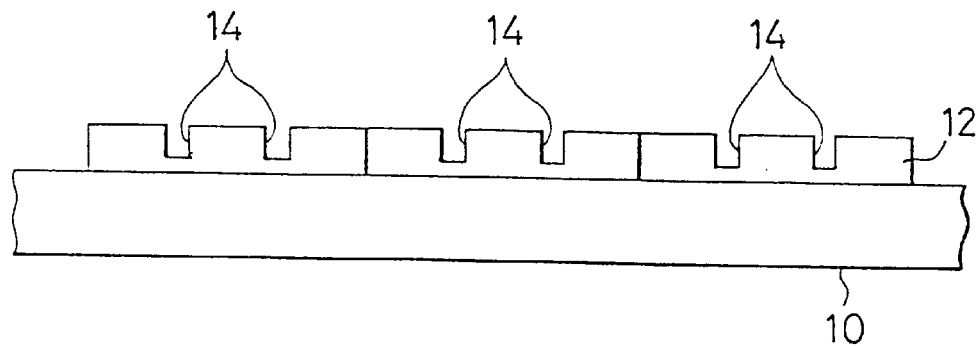
FIG. 4 is a diagram for explaining the prior art process of forming an alignment mark.

FIG. 3 is a longitudinal sectional view of a silicon substrate 302 for the purpose of explaining a method for covering a base recess according to the third embodiment of the invention. As shown in the figure, the first oxide film layer 304 is formed over the surface of the silicon substrate 302 by means of thermal oxidation, natural oxidation, and so forth. In the next, a base recess 306 is formed in the first oxide film layer 304 by etching, and so forth. The silicon substrate 302 as shown has a structure identical to the prior art structure which has been already described referring to FIG. 4.

Figure 5:
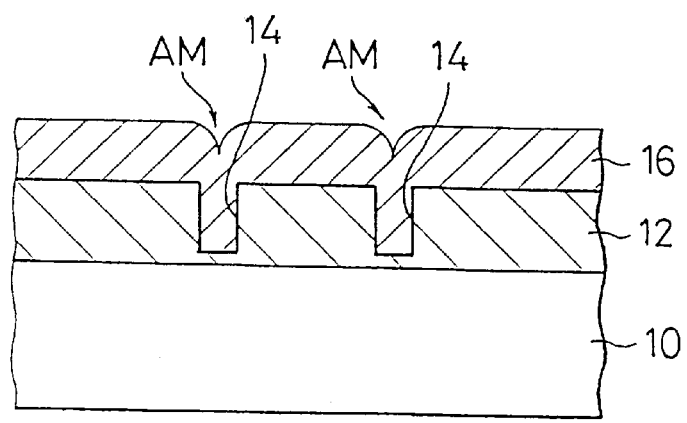
FIG. 5 is a diagram for explaining the prior art process of forming an alignment mark.
Figure 6:
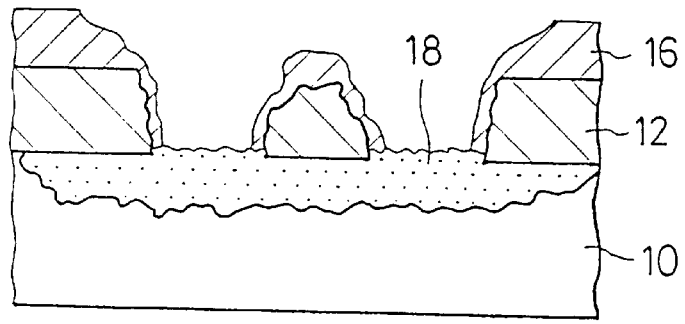
FIG. 6 is a diagram showing a state of a destroyed alignment caused by Al—Si chemical reaction.

In case of forming the base recess 306 by etching and so forth the first oxide film layer 304 which is generated by oxidizing the surface of the silicon substrate 302, since the first oxide film layer 304 is relatively thin, if the depth of the base recess 306 is unexpectedly deepened due to change in the process condition such as process time, temperature, etchant, and so on, there is a possibility that the metallic silicon of the silicon substrate 302 is exposed to the inside of the base recess 306. If the Al wiring layer is formed over the first oxide film layer 304 leaving such a state of the base recess 306 as it is, the Al wiring layer directly comes in contact with the metallic silicon of the silicon substrate 302, which would never fail to cause the problems as previously described referring to FIGS. 4 through 6.

Therefore, the third embodiment is characterized in that a second oxide film layer 308 is additionally formed over the first oxide film layer 304 which is formed the base recess 306, thereby filling up the base recess 306 formed in the first oxide film layer 304 with the second oxide film 308. The second oxide film layer 308 may be formed by using a proper method such as the CVD method.

According to this method in the case of forming Al wiring layer 310, since the base recess 306 is already filled up with the second oxide film layer 308, it is avoided that the Al wiring layer 310 directly comes in contact with the metallic silicon of the silicon substrate 302, so that no Al—Si chemical reaction is caused thus enabling the base recess 306 in the first oxide film layer 304 to be protected from destruction.

As has been discussed in the above, according to the alignment mark as formed according to the invention, since the metallic silicon of the silicon substrate can not come in contact with the Al wiring layer, there is caused neither Al—Si chemical reaction between silicon and aluminum, nor deterioration in the quality of the oxide film layer. Consequently, the alignment mark on the surface of the Al wiring layer is never damaged or destroyed.

According to the method of covering the base recess of the invention, since the base recess which is already formed in the first oxide film layer over the silicon substrate is concealed by the second oxide film layer, the Al wiring layer formed over the second oxide film layer can not come in contact with the metallic silicon of the silicon substrate. Therefore, no Al—Si chemical reaction is caused, thus no destruction being caused over the base recess already formed in the first oxide film.

Preferred embodiments of the structure of the alignment mark and the concealing structure of the same according to the invention have been discussed thus far with reference to the accompanying drawings. However, the invention should not be limited by these embodiments. It will be clearly understood by one skilled in the art that various changes and modifications of the embodiments may be made within the technical thoughts as recited in the scope of claim for patent as per attached hereto and that those changes and modifications should also fall in the technical scope of the invention.

The entire disclosure of Japanese No. 9-187550 filed on Jun. 27, 1997 including specification, claims, drawings and summary is incorporated herein by reference in its entirety.

What is claimed is:

1. A method for forming an alignment mark as used in the process of manufacturing a silicon semiconductor device, comprising:

forming an oxide film over the surface of a silicon substrate, the oxide film comprising a first oxide film on the silicon substrate and a second oxide film on the first oxide film;

forming a base recess by etching said oxide film in part at a predetermined position thereon such that said base recess has a depth less than that thickness of said oxide film; and forming an aluminum layer over said oxide film so as to fill up said base recess therewith;

thereby having a mark as an alignment mark come out on the surface of said aluminum layer, taking a position in correspondence with the position of said base recess.

2. A method as claimed in claim 1, wherein said base recess is formed by etching said second oxide film in part.

3. A method as claimed in claim 2, wherein said second oxide film has a multiple oxide layer structure.

4. A method as claimed in claim 1, wherein said aluminum layer is formed by sputtering aluminum on the oxide film layer at a high temperature.

5. A method as claimed in claim 1, wherein said base recess is etched by using fluoride gas as an etchant.

6. A method for forming an alignment mark as used in the process of manufacturing a silicon semiconductor device, comprising the steps of:

forming the first oxide film over the surface of a silicon substrate;

forming a lower aluminum layer over said first oxide layer;

forming a base recess by etching said second oxide film in part at a predetermined position thereon; and forming an upper aluminum layer over said second oxide film to fill up said base recess therewith;

thereby having a mark as an alignment mark come out on the surface of said upper aluminum layer, taking a position in correspondence with the position of said reference mark.

7. A method as claimed in claim 6, wherein said second oxide film has a multiple oxide layer structure.

8. A method as claimed in claim 6, wherein said aluminum layer is formed by means of sputtering aluminum on the oxide layer at a high temperature.

9. A method as claimed in claim 6, wherein said base recess is etched by using fluoride gas as an etchant.

10. A method of forming a structure for covering an alignment mark comprising:

forming a first oxide film over the surface of a silicon substrate;

forming a base recess by etching said first oxide film in part at a predetermined position thereon;

forming a second oxide film over said first oxide film to fill up said base recess therewith; and forming an aluminum layer over said second oxide film.

11. A method as claimed in claim 10, wherein said second oxide film has a multiple oxide layer structure.

12. A method as claimed in claim 10, wherein said aluminum layer is formed by sputtering aluminum on the oxide film at a high temperature.

13. A method as claimed in claim 10, wherein said base recess is etched by using fluoride gas as an etchant.

* * * * *